United States Patent
Brown et al.

(10) Patent No.: US 6,352,912 B1
(45) Date of Patent: Mar. 5, 2002

(54) REDUCTION OF REVERSE SHORT CHANNEL EFFECTS BY DEEP IMPLANTATION OF NEUTRAL DOPANTS

(75) Inventors: Jeffrey Scott Brown, Middlesex; Stephen Scott Furkay, South Burlington; Robert J. Gauthier, Jr., Hinesburg; Dale Warner Martin, Hyde Park; James Albert Slinkman, Montpelier, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/539,527

(22) Filed: Mar. 30, 2000

(51) Int. Cl.$^7$ ............................................ H01L 21/265
(52) U.S. Cl. ...................... 438/528; 438/289; 438/306
(58) Field of Search ................. 438/528, 527, 438/302, 306, 289

(56) References Cited

U.S. PATENT DOCUMENTS

| | | | |
|---|---|---|---|
| 4,835,112 A | 5/1989 | Pfiester et al. ................. 437/24 |
| 5,095,358 A | 3/1992 | Aronowitz et al. ........... 357/63 |
| 5,245,208 A | * 9/1993 | Eimori |
| 5,360,749 A | 11/1994 | Anjum et al. .................. 437/24 |
| 5,750,435 A | 5/1998 | Pan .............................. 438/525 |
| 5,792,699 A | 8/1998 | Tsui ............................. 438/290 |
| 5,858,864 A | * 1/1999 | Aronowitz et al. |
| 5,874,329 A | 2/1999 | Neary et al. ................. 438/203 |
| 5,885,886 A | 3/1999 | Lee .............................. 438/528 |
| 5,891,792 A | * 4/1999 | Shih et al. |
| 6,087,209 A | * 7/2000 | Yeap et al. |
| RE37,158 E | * 5/2001 | Lee |

OTHER PUBLICATIONS

Stanley Wolf and Richard N. Tauber, "Silicon Processing for the VLSI Era—vol. 1: Process Technology," Lattice Press, Sunset Beach, CA (1986), p. 175.*

Pfiester et al., "Improved MOSFET Short–Channel Device Using Germanium Implantation," IEEE Electron Device Letters, vol. 9, No. 7, Jul. 1988, pp. 343–346.*

Ng et al., "Suppression of Hot–Carrier Degradation in Si MOSFET's by Germanium Doping," IEEE Electron Device Letters, vol. 11, No. 1, Jan. 1990, pp. 45–47.*

* cited by examiner

Primary Examiner—Charles Bowers
Assistant Examiner—Stephen W. Smoot
(74) Attorney, Agent, or Firm—Mark F. Chadurjian; Cantor Colburn LLP

(57) ABSTRACT

A FET with reduced reverse short channel effects is described, as well as a method to make said FET. Germanium is implanted throughout a semiconductor substrate at an intensity and dose such that a peak ion concentration is created below the source and drain of the FET. The germanium can be implanted prior to gate and source and drain formation, and reduces the reverse short channel effect normally seen in FETs. The short channel effect normally occurring in FETs is not negatively impacted by the germanium implant.

25 Claims, 8 Drawing Sheets

REDUCTION OF REVERSE SHORT CHANNEL EFFECTS BY DEEP IMPLANTATION OF NEUTRAL DOPANTS

BACKGROUND OF THE INVENTION

The present invention relates generally to semiconductor devices and specifically to reverse short channel effects occurring in semiconductor devices.

The trend of decreasing feature size in semiconductor integrated circuits has led to devices with channel lengths approaching 0.05 microns. As the effective channel length ($L_{eff}$) decreases, however, the gate voltage at which the conductivity of the channel is inverted and conduction occurs—the threshold voltage—increases above the theoretically predicted level. FIG. 1 shows this increase in voltage, or reverse short channel effect (RSCE), which is generally an undesirable effect. The dashed line in FIG. 1 represents an ideal channel conductivity behavior in a gated device.

The tendency towards higher threshold voltages with decreased channel length reverses at some point, and the threshold voltage drops off dramatically. This sudden decrease in threshold voltage is referred to as the short channel effect (SCE). Conventionally, as action is taken to reduce the RSCE, the SCE worsens, which is an undesirable collateral effect.

The RSCE is generally believed to be caused in n-type metal oxide semiconductor field effect transistors (NMOSFETs) by pile-up of threshold boron at the edge of the source and drain, as well as generally uneven boron distribution across the channel region in FETs with short channels. Supplemental implantation of p-type ions in the channel region has been used to attempt to prevent the RSCE by reducing the impact of boron pile-up in the channel region.

Another technique that has been employed to reduce the RSCE in FETs is the implantation of germanium into the source and drain regions of the FET. FIG. 2 shows a cross-section of an NFET generally at 10, in which shallow germanium implants 22 have been incorporated into the source 18 and drain 20 regions. A p-type silicon substrate 12 comprises a gate 14 disposed on a gate oxide 15 and between sidewall spacers 16. The source 18 and drain 20 diffusions each have shallow germanium implants 22 that are formed to prevent the RSCE.

Conventional techniques used to reduce the RSCE, however, can require additional processing steps and can cause unwanted collateral effects on the performance of the device. What is needed in the art is a method for fabricating a semiconductor device that does not suffer from RSCEs.

BRIEF SUMMARY OF THE INVENTION

The present invention is a semiconductor device comprising a semiconductor substrate, a first diffusion region disposed in said substrate, a second diffusion region disposed in said substrate, a channel region disposed between said first diffusion region and said second diffusion region, a gate oxide disposed on said semiconductor substrate over said channel region and overlapping said first diffusion region and said second diffusion region, a gate electrode disposed on said gate oxide, and a neutral dopant diffusion implant disposed throughout said substrate, said neutral dopant diffusion implant having a peak concentration below said first diffusion region and said second diffusion region.

The process for making said device comprises forming an oxide layer on a semiconductor substrate of a first conductivity type, blanket-implanting a neutral dopant into said substrate to form a neutral dopant implant, forming a gate electrode on said oxide layer, and, implanting source and drain regions into said substrate to a depth less than the depth at which a peak concentration of said germanium implant occurs.

BRIEF DESCRIPTION OF THE DRAWINGS

The present invention will now be described, by way of example only, with reference to the accompanying drawings which are meant to be exemplary, not limiting, and wherein like elements are numbered alike in several FIGURES, in which.

DETAILED DESCRIPTION OF THE INVENTION

The semiconductor device described herein has a neutral dopant implant, such as germanium, formed with a peak concentration below the source and drain regions. The germanium implant is preferably implanted before source, drain, and gate formation, but implantation after source, drain, and gate formation is possible. The resulting device, which can be a FET, is not subject to reverse short channel effects, and the implant causes no degradation of short channel effects. Although the figures and the following description disclose the invention in an NFET embodiment for clarity, those skilled in the are will realize that the invention is applicable to other semiconductor devices having gate controlled diffusion regions. For example, a PFET can be formed by reversing the doping polarities from the NFET version.

Figure 1:
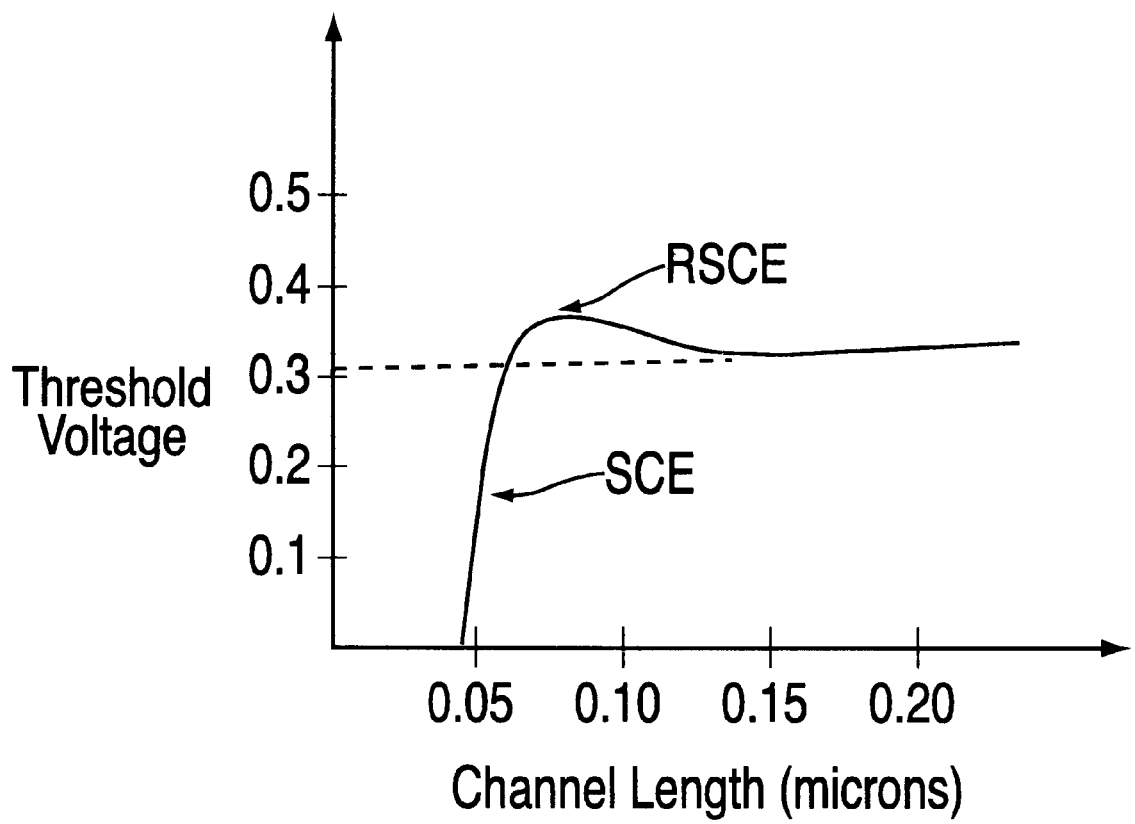
FIG. 1 is a graph showing the reverse short channel effect and the short channel effect.
Figure 2:
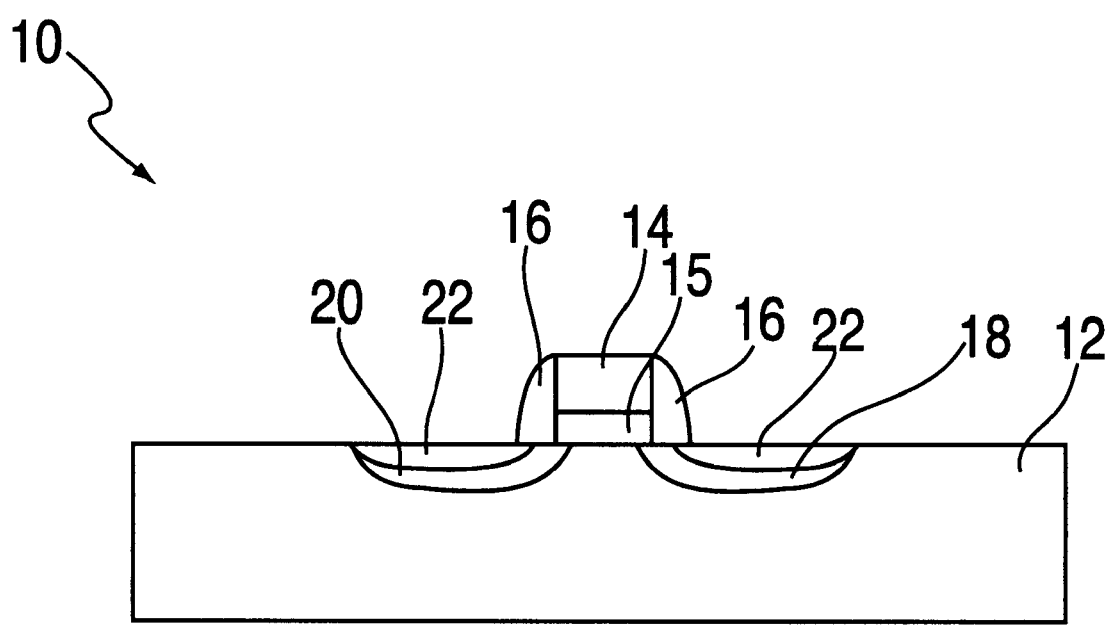
FIG. 2 is a cross-section of FET showing a conventional germanium implant within the source and drain.
Figure 3:
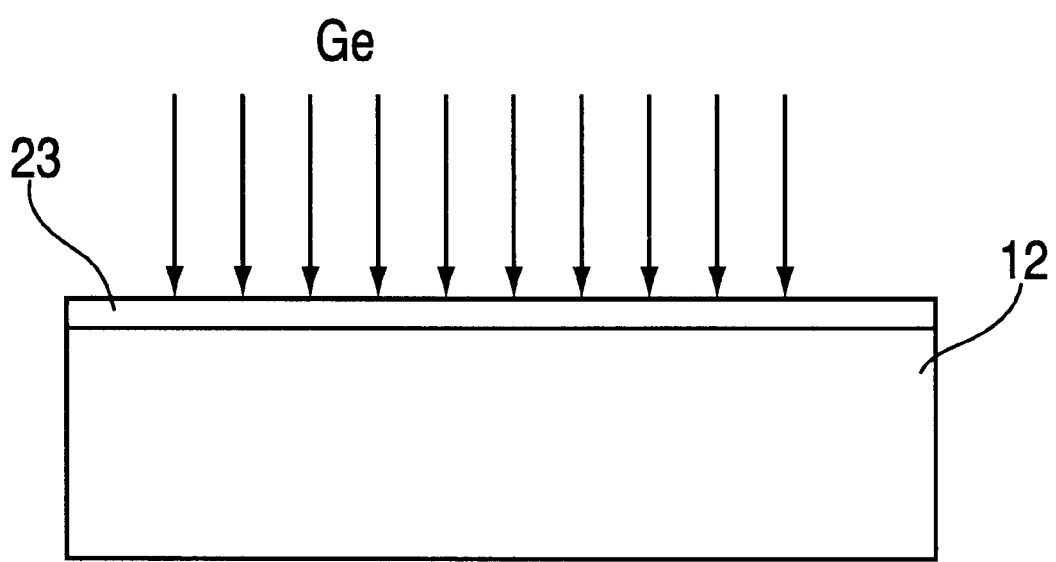
FIG. 3 is a cross-section of a wafer covered with an oxide layer during germanium doping.

Referring now to FIG. 3, an NFET has a p-type silicon region 12 on which an oxide layer 23 has been deposited or grown using conventional methods. The p-type silicon region 12 can be a doped monocrystalline wafer such as would be used in an NFET application, or a well of p-type silicon formed by ion implantation of an n-type silicon as would be used in the NFET portion of a CMOS application. The oxide layer 23 is generally formed with an initial thickness of from about 0.04 to about 0.06 microns, with a thickness of about 0.05 microns preferred. The p-type silicon region 12 can be doped with a p-type dopant such as boron to an initial concentration of $1 \times 10^{17}$ to about $2 \times 10^{18}$ atoms/cm$^3$, with about $3 \times 10^{17}$ atoms/cm$^3$ preferred.

The neutral dopant implant is preferably implanted with enough energy to form a peak neutral dopant concentration in the wafer below the bottom of the source and the drain diffusion implants which are implanted in a later step. Although any neutral dopant can be used, such as silicon or germanium, germanium is the preferred neutral dopant. In one embodiment, the germanium is implanted to form a peak at a depth of about 0.10 to about 0.50 microns, with a depth of about 0.15 to about 0.30 microns preferred, and a depth of about 0.20 to about 0.25 microns especially preferred. A final peak germanium concentration of about $10^{19}$ cm$^{-3}$ to about $10^{21}$ cm$^{-3}$ is preferred, with a concentration of about $10^{20}$ especially preferred. The germanium concentration at the surface of the p-type silicon region 12 is preferably about $10^{17}$ cm$^{-3}$ to about $10^{19}$ cm$^{-3}$, with a concentration of about $10^{18}$ cm$^{-3}$ especially preferred. The germanium concentration can vary in any manner between the surface of the p-type silicon region 12 and the peak concentration, but a logarithmic variation is preferred (see, for example, FIG. 6). In order to form the germanium implant at the correct depth and concentration, the germanium ions can be implanted, for example, with from about 230 to about 270 keV at about $10^{13}$ cm$^{-2}$ to about $10^{16}$ cm$^{-2}$, and preferably with about 245 to about 255 keV at about $10^{14}$ cm$^{-2}$ to about $10^{15}$ cm$^{-2}$.

Figure 4:
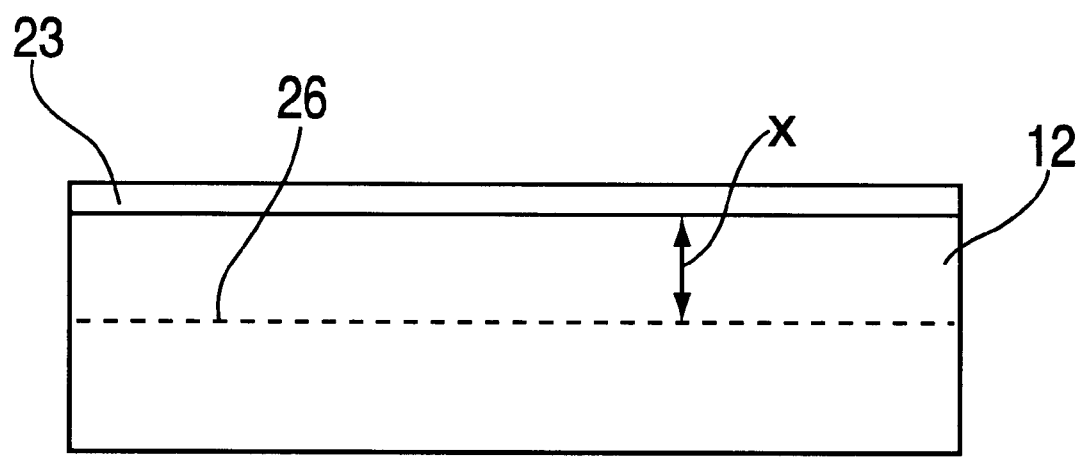
FIG. 4 is a cross-section of the wafer of FIG. 3 after doping.

FIG. 4 shows a cross-section of the NFET after implantation of germanium. The distance "x" represents the distance from the surface of the p-type silicon region to the peak concentration of the germanium implant, as described above. The dashed line 26 represents the germanium implant peak concentration depth. The germanium concentration decreases in both directions from the peak concentration depth 26. Distance "x" can be any value that results in an appropriate germanium concentration in the source, drain, and channel region of the NFET, and preferably has a value as described above.

Figure 5:
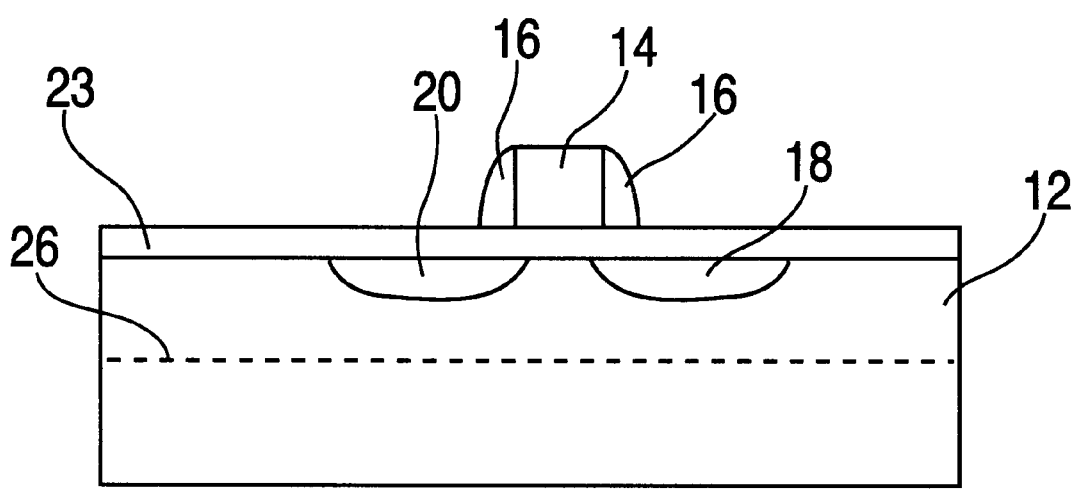
FIG. 5 is cross-section of the wafer of FIG. 4 after gate formation and source and drain doping.

Referring now to FIG. 5, the NFET is shown after gate formation, and source and drain doping. Gate formation is performed using well-known techniques, and the gate 14 can be a polysilicon gate. Prior to gate formation, the oxide layer 23 is patterned and etched to result in a gate oxide with a thickness of about 4 to about 11 nanometers. A polysilicon layer is then formed, patterned, and etched, to result in a polysilicon gate 14 having a thickness of about 100 to about 200 nanometers.

Once the gate 14 has been formed, the source 18 and the drain 20 diffusion regions can be doped. Ion implantation of the source 18 and drain 20 with an n-type impurity results in an ion concentration of about $10^{19}$ to about $10^{21}$, with a concentration of about $10^{20}$ preferred. Source 18 and drain 20 regions are preferably implanted to a depth of less than about 0.15 microns, with a depth of less than about 0.10 microns especially preferred. Side wall spacers 16 comprising oxide or nitride can optionally be formed on the sides of the gate 14 in order to form a second implant (not shown) in the source 18 and the drain 20.

At this stage, the germanium implant is diffused in the source 18, drain 20, and the channel between the source 18 and the drain 20. Annealing is performed to activate the dopants and restore the crystal structure of the silicon substrate. Annealing can take place between about 600 to about 1200 degrees Celsius. After annealing, NFET fabrication can be completed using conventional metalization and passivation techniques.

Figure 6:
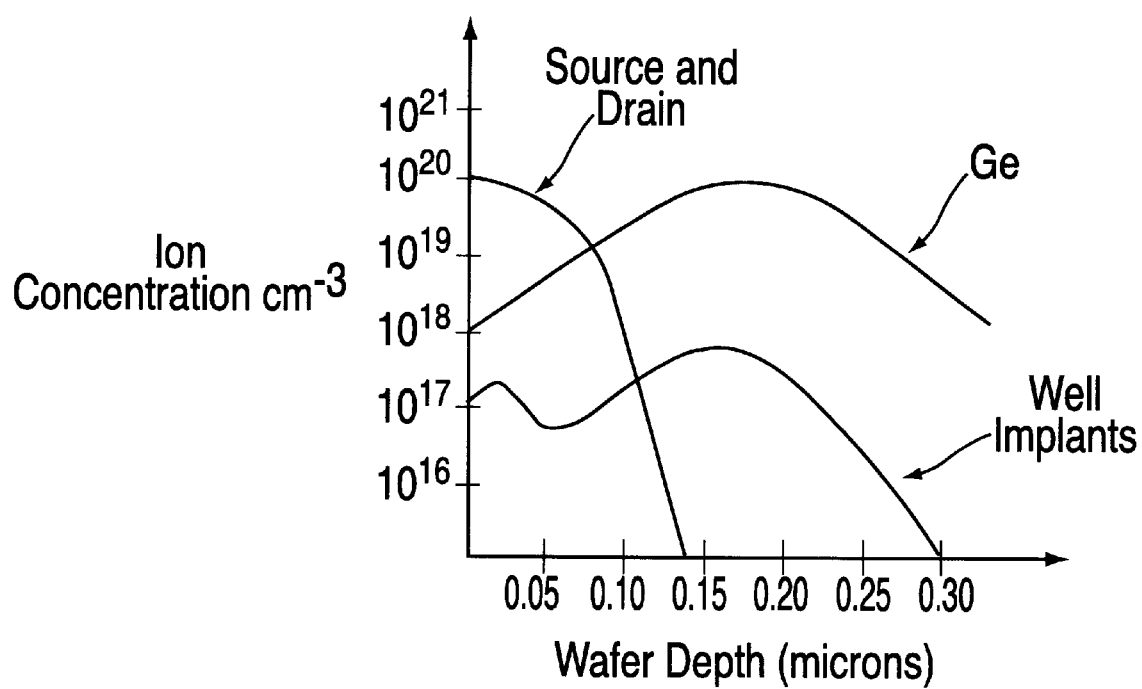
FIG. 6 is a graph showing the relative dopant concentrations in one embodiment of the FET.

FIG. 6 shows the ion concentrations for the various regions of the NFET. As described above, and as shown in FIG. 6, the peak germanium implant concentration is preferably formed deeper in the wafer than are the source and drain implants. In the NFET described above, the source and drain implants are an n-type ion, and the wafer ion is a p-type ion. The concentrations and depths shown in FIG. 6 and described above are exemplary, and one skilled in the art will realize that alternative doping concentrations and implantation depths are possible and within the scope of this invention.

Figure 7:
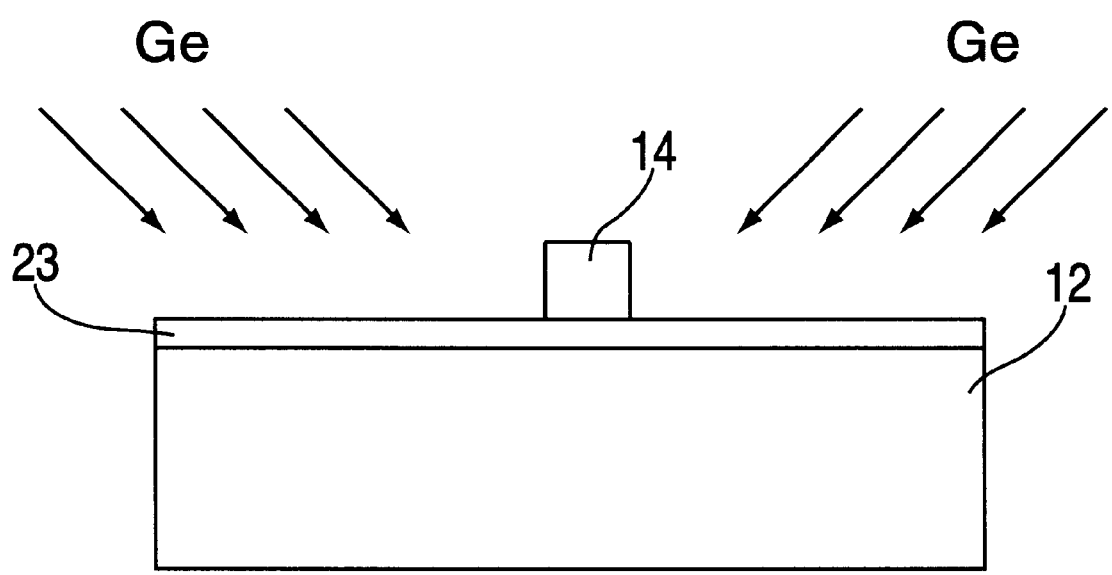
FIG. 7 is a cross-section of a FET undergoing germanium implantation with a gate electrode already formed on the oxide layer; and, FIG. 8 is a graph showing the reduction of the RSCE without a consequent worsening of the SCE for a FET with a germanium implant.

Importantly, the germanium can be implanted at any stage of the NFET fabrication process before source and drain formation. For example, the germanium can be implanted before formation of the oxide layer 23, or after formation of the gate electrode 14. FIG. 7 shows the germanium implantation step being performed after the gate 14 has already been formed. In order to effectively implant the germanium under the gate 14 in the channel region, the germanium ions must be implanted at an angle, as shown in FIG. 7. Implantation energy and dose are adjusted to compensate for the angle of implantation. The germanium implant can also be implanted after the source 18 and drain 20 have been formed, and before or after the side wall spacers 16 have been formed, using the implantation technique shown in FIG. 7.

Figure 8:
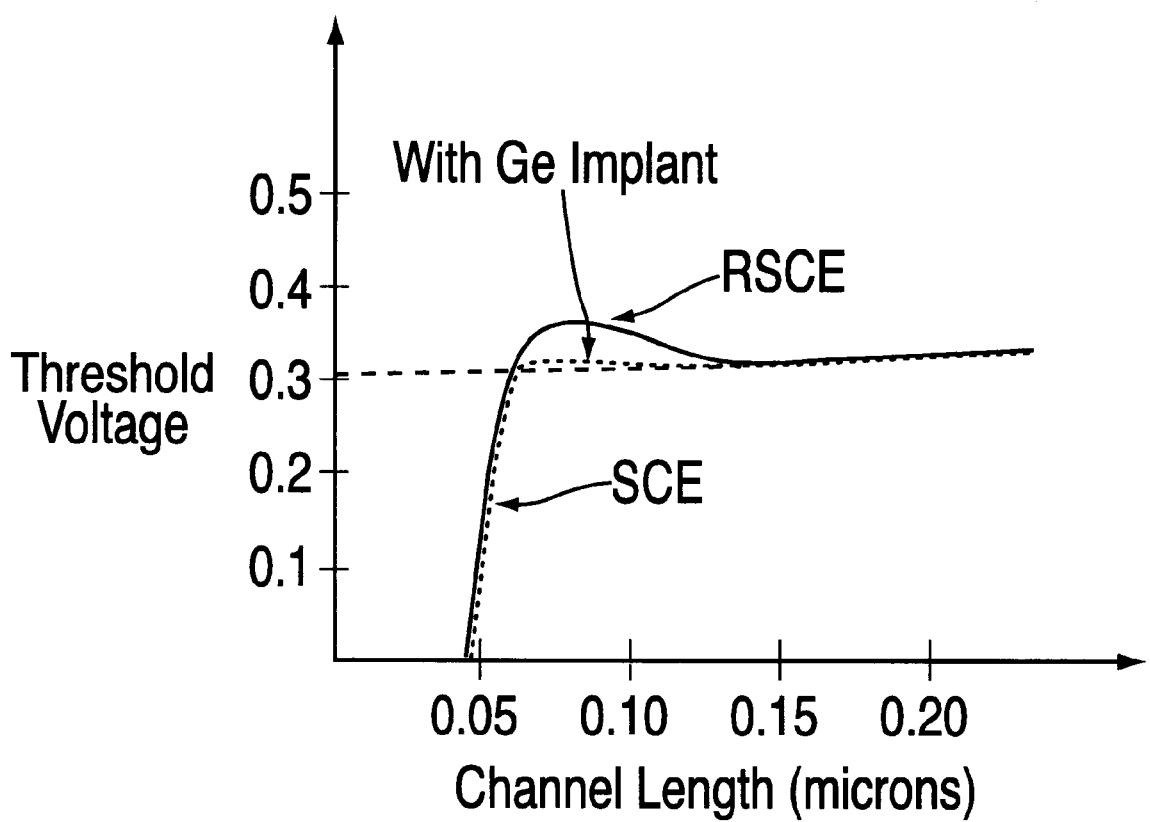

The blanket implantation of germanium in the p-type substrate inhibits boron pile-up and channel inconsistency, thereby reducing the RSCE by at least 15 percent or more, depending on the device technology. FIG. 8 is a graph that compares the short channel threshold voltage of the germanium implanted NFET of the present invention with a conventional NFET lacking the germanium implant. The NFET with the germanium implant is represented by the dotted line. The reverse short channel effect is reduced to close to an ideal level for the germanium implanted NFET. The short channel effect, however, does not worsen with the germanium implant.

The NFET described above has the advantage of a significantly reduced reverse short channel effect, without commensurate degradation of the short channel effect or other critical features of the NFET device. The single germanium implantation step allows easy incorporation of the germanium implant in standard NFET and CMOS applications.

While preferred embodiments have been shown and described, various modifications and substitutions may be made thereto without departing from the spirit and scope of the invention. Accordingly, it is to be understood that the present invention has been described by way of illustration only, and such illustrations and embodiments as have been disclosed herein are not to be construed as limiting to the claims.

What is claimed is:

1. A process for manufacturing a semiconductor device having a gate formed on, and diffusion regions formed in, a semiconductor substrate, the process comprising:
   prior to the formation of said gate, blanket implanting a neutral dopant into said semiconductor substrate at an energy dose sufficient to implant said neutral dopant at a depth greater than a depth of said diffusion regions; wherein said neutral dopant is further implanted to form a peak concentration at about 0.15 to about 0.50 microns deep.

2. The process of claim 1 wherein said neutral dopant is germanium and said implanting step includes implanting said germanium prior to formation of said diffusion regions.

3. The process of claim 1 wherein said semiconductor device comprises an NFET device.

4. The process of claim 1 wherein said neutral dopant is germanium and said implanting step includes implanting said germanium at a dose sufficient to prevent over-diffusion of dopants in said semiconductor substrate between said diffusion regions relative to dopants in said diffusion regions during a heating phase of said process.

5. The process of claim 1 wherein said neutral dopant is germanium and said semiconductor device is a FET.

6. The process of claim 1 wherein said neutral dopant is germanium and said diffusion regions are source and drain diffusion regions.

7. The process of claim 1 wherein said gate is polysilicon.

8. The process of claim 1 wherein said neutral dopant is germanium and said semiconductor substrate is silicon.

9. The process of claim 1 wherein said neutral dopant is germanium and said germanium is implanted into said semiconductor substrate to form said peak concentration at about 0.15 to about 0.30 microns deep.

10. The process of claim 1 wherein said neutral dopant is germanium and said germanium is implanted into said semiconductor substrate to form said peak concentration at about 0.20 to about 0.25 microns deep.

11. The process of claim 1 wherein said neutral dopant is germanium and said germanium is implanted to have said peak concentration of about $10^{19}$ to about $10^{21}$ germanium ions $cm^{-3}$.

12. The process of claim 1 wherein said neutral dopant is germanium and said germanium is implanted to have said peak concentration of about $10^{20}$ germanium ions $cm^{-3}$.

13. The process of claim 1 wherein said neutral dopant is germanium and said implanting is done after formation of said diffusion regions.

14. The process of claim 1 wherein said neutral dopant is silicon.

15. A process for fabricating an FET comprising:

forming an oxide layer on a semiconductor substrate of a first conductivity type;

blanket-implanting neutral dopant ions into said substrate to form a neutral dopant implant;

following said blanket-implanting neutral dopant ions into said substrate, forming a gate electrode on said oxide layer; and, implanting source and drain regions into said substrate to a depth less than the depth at which a peak concentration of said neutral dopant implant occurs;

wherein said neutral dopant is further implanted to form said peak concentration at about 0.15 to about 0.50 microns deep.

16. The process of claim 15 wherein said neutral dopant ions are germanium and said blanket-implanting step includes implanting said germanium at a dose sufficient to prevent over-diffusion of dopants in said semiconductor substrate between said source and said drain regions relative to dopants in said source and said drain regions during a heating phase of said process.

17. The process of claim 15 wherein said neutral dopant ions are germanium and said gate is polysilicon.

18. The process of claim 15 wherein said neutral dopant ions are germanium and said semiconductor substrate is silicon.

19. The process of claim 15 wherein said neutral dopant ions are germanium and said germanium is implanted into said semiconductor substrate to form said peak concentration at about 0.15 to about 0.30 microns deep.

20. The process of claim 15 wherein said neutral dopant ions are germanium and said germanium is implanted into said semiconductor substrate to form said peak concentration at about 0.20 to about 0.25 microns deep.

21. The process of claim 15 wherein said neutral dopant ions are germanium and said germanium is implanted to have said peak concentration of about $10^{19}$ to about $10^{21}$ germanium ions $cm^{-3}$.

22. The process of claim 21 wherein said neutral dopant is germanium and said germanium is implanted to have said peak concentration of about $10^{20}$ germanium ions $cm^{-3}$.

23. The process of claim 15 wherein said FET comprises an NFET device.

24. The process of claim 15 wherein said neutral dopant ions are germanium and said blanket-implanting is done after formation of said diffusion regions.

25. The process of claim 15 wherein said neutral dopant ions are silicon.

* * * * *